(12) United States Patent
Ahrens et al.

(10) Patent No.: US 9,971,382 B2
(45) Date of Patent: May 15, 2018

(54) SUPER-ELASTIC HINGE FOR FLEXIBLE DISPLAY

(71) Applicant: Intel Corporation, Santa Clara, CA (US)

(72) Inventors: Michael Ahrens, San Jose, CA (US); George H. Daskalakis, Forest Grove, OR (US); Steven J. Lofland, Portland, OR (US); David Pidwerbecki, Hillsboro, OR (US); Bo Qiu, Hillsboro, OR (US); James C. Raupp, Hillsboro, OR (US); Stacy L. Yee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/201,097

(22) Filed: Jul. 1, 2016

(65) Prior Publication Data

US 2018/0004252 A1   Jan. 4, 2018

(51) Int. Cl.
| | | |
|---|---|---|
| *G06F 1/16* | (2006.01) | |
| *E05D 3/02* | (2006.01) | |
| *H05K 5/02* | (2006.01) | |
| *H04M 1/02* | (2006.01) | |

(52) U.S. Cl.
CPC .......... *G06F 1/1652* (2013.01); *E05D 3/022* (2013.01); *G06F 1/1616* (2013.01); *G06F 1/1681* (2013.01); *E05Y 2900/606* (2013.01); *H04M 1/0268* (2013.01); *H05K 5/0226* (2013.01)

(58) Field of Classification Search
CPC .... G06F 1/1652; G06F 1/1681; G06F 1/1616; E05D 3/022; E05Y 2900/606; H04M 1/0268; H05K 5/0226
See application file for complete search history.

(56) References Cited

U.S. PATENT DOCUMENTS

| 8,228,667 B2 * | 7/2012 | Ma ........................ | G06F 1/1652 361/679.01 |
|---|---|---|---|
| D761,251 S * | 7/2016 | Senda ......................... | D14/341 |
| 2003/0048256 A1* | 3/2003 | Salmon ................. | G06F 1/1613 345/168 |
| 2010/0085274 A1* | 4/2010 | Kilpatrick, II ........ | G06F 1/1616 345/1.3 |
| 2011/0148797 A1* | 6/2011 | Huitema ............... | G06F 1/1615 345/173 |
| 2011/0188189 A1* | 8/2011 | Park ....................... | G05B 11/01 361/679.05 |

(Continued)

OTHER PUBLICATIONS

International Search Report and Written Opinion for International Patent Application No. PCT/US2017/035181, dated Sep. 8, 2017, 14 pages.

*Primary Examiner* — Dimary Lopez Cruz
*Assistant Examiner* — Abhishek Rathod
(74) *Attorney, Agent, or Firm* — Jordan IP Law, LLC

(57) ABSTRACT

Systems, methods and apparatuses may provide for a flexible display assembly including a flexible display and a backplane coupled to the flexible display, wherein at least a portion of the backplane comprises a super elastic sheet. In one example, the backplane includes a first rigid sheet metal portion and a second rigid sheet metal portion, wherein the super-elastic sheet is joined between the first and second rigid sheet metal portions.

22 Claims, 16 Drawing Sheets

(56) References Cited

U.S. PATENT DOCUMENTS

| | | | |
|---|---|---|---|
| 2012/0212433 A1* | 8/2012 | Lee | G06F 1/1652 345/173 |
| 2012/0264489 A1* | 10/2012 | Choi | H04M 1/0216 455/566 |
| 2012/0307423 A1* | 12/2012 | Bohn | G06F 1/1641 361/679.01 |
| 2013/0010405 A1* | 1/2013 | Rothkopf | H04M 1/0216 361/679.01 |
| 2013/0221840 A1* | 8/2013 | Oh | H01L 51/5237 313/511 |
| 2013/0342094 A1 | 12/2013 | Walters et al. | |
| 2014/0111954 A1 | 4/2014 | Lee et al. | |
| 2014/0328041 A1 | 11/2014 | Rothkopf et al. | |
| 2015/0055287 A1* | 2/2015 | Seo | G06F 1/1652 361/679.27 |
| 2015/0062525 A1* | 3/2015 | Hirakata | G02F 1/133305 349/158 |
| 2015/0233162 A1 | 8/2015 | Lee et al. | |
| 2016/0070304 A1 | 3/2016 | Shin et al. | |

* cited by examiner

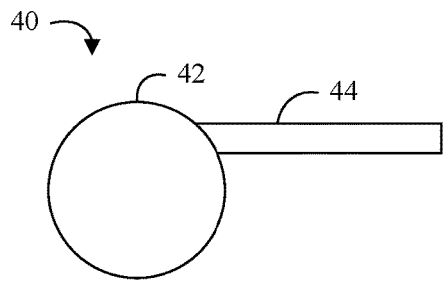
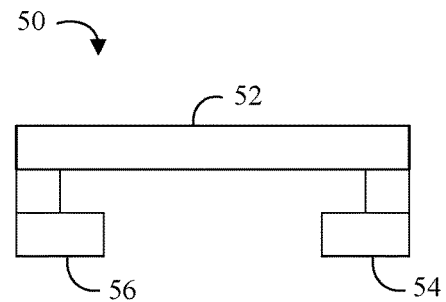
FIG. 4A  FIG. 5A
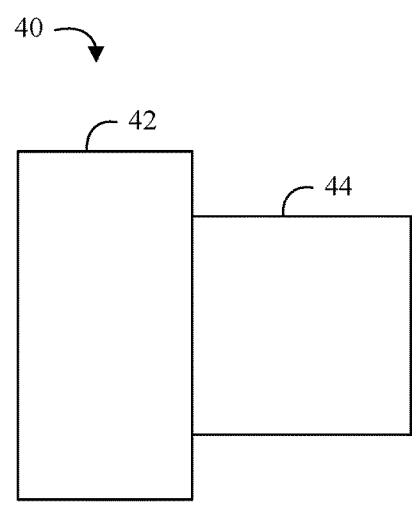
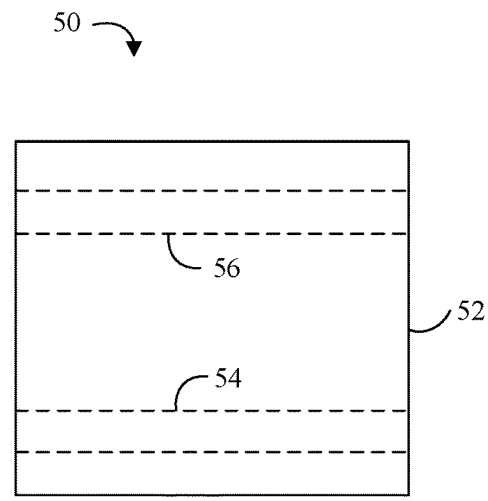
FIG. 4B  FIG. 5B

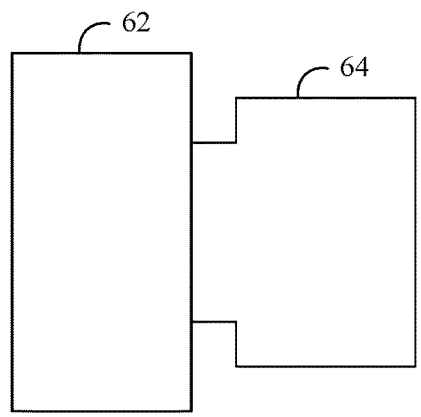
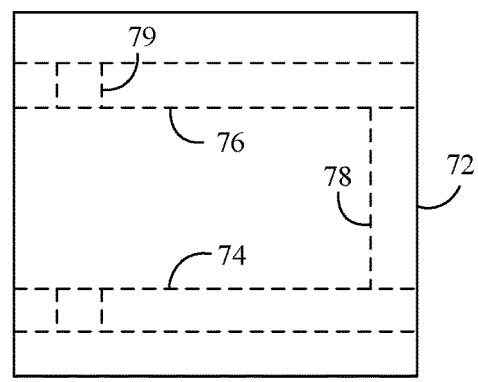
FIG. 6  FIG. 7
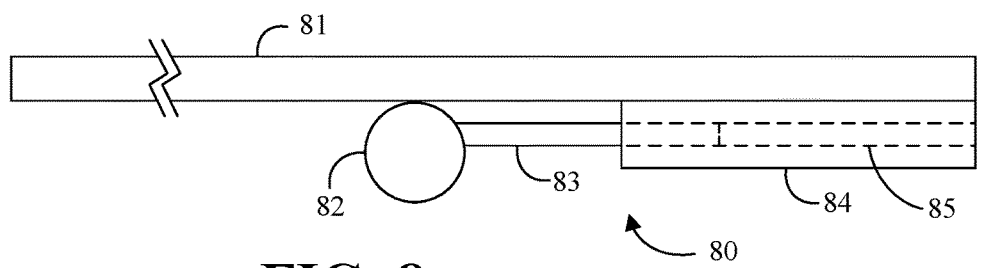
FIG. 8
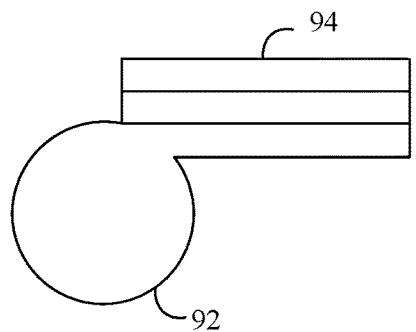
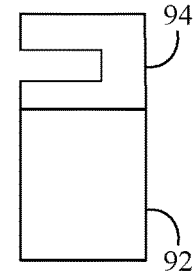
FIG. 9A  FIG. 9B

SUPER-ELASTIC HINGE FOR FLEXIBLE DISPLAY

TECHNICAL FIELD

Embodiments generally relate to hinges for displays. More particularly, embodiments relate to hinge and support structures for flexible displays.

BACKGROUND

Flexible displays including organic light emitting diodes (OLEDs) may provide a variety of applications and form factors. A flexible display may include a hermetic seal that is maintained for the life of the display. A flexible display may exhibit a variety of material properties including a minimum bend radius that defines how tightly the flexible display can bend without compromising the flexible display or the hermetic seal.

BRIEF DESCRIPTION OF THE DRAWINGS

The various advantages of the embodiments will become apparent to one skilled in the art by reading the following specification and appended claims, and by referencing the following drawings, in which:

FIG. 4A is an illustrative side view of an example of a hinge apparatus according to an embodiment;

FIG. 4B is a top view of an example of the hinge apparatus according to the embodiment of FIG. 4A;

FIG. 5A is an illustrative front view of an example of a support structure according to an embodiment;

FIG. 5B is a top view of an example of the support structure according to the embodiment of FIG. 5A;

FIG. 6 is an illustrative top view of an example of another hinge apparatus according to an embodiment;

FIG. 7 is an illustrative top view of an example of another support structure according to an embodiment;

FIG. 8 is a block diagram of an example of a support assembly for a flexible display according to an embodiment;

FIG. 9A is an illustrative side view of an example of a channel support according to an embodiment;

FIG. 9B is a front view of an example of the channel support according to the embodiment of FIG. 9A;

DESCRIPTION OF EMBODIMENTS

Figure 1:
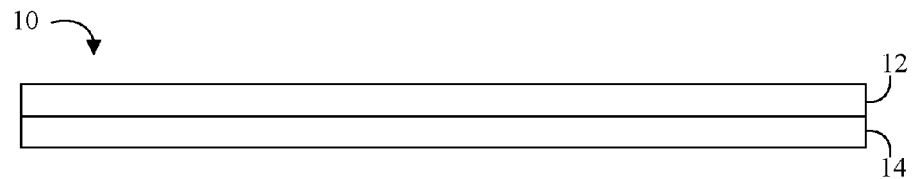
FIG. 1 is a block diagram of an example of a flexible display assembly according to an embodiment.

Turning now to FIG. 1, embodiments of a flexible display assembly 10 may include a flexible display 12 and a backplane 14 coupled to the flexible display 12. Advantageously, at least a portion of the backplane 14 comprises a super elastic sheet. The super-elastic sheet may include a super-elastic metal alloy such as, for example, nickel titanium (NiTi)/nitinol. Indeed, part or all of the backplane 14 may be made from nitinol.

Figure 2A:
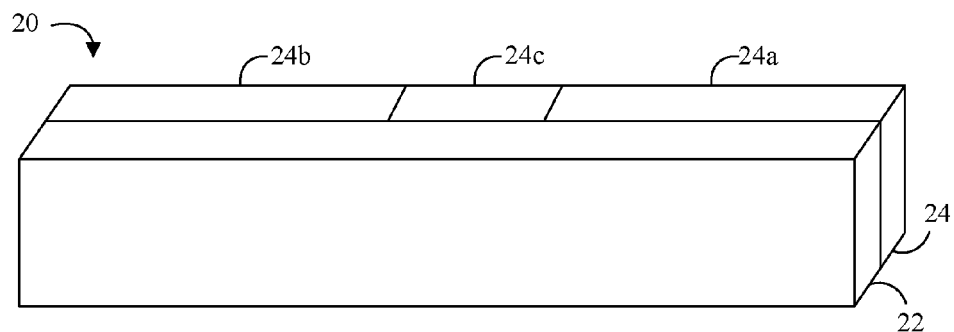
FIG. 2A is an illustrative perspective view of an example of another flexible display assembly according to an embodiment.
Figure 2B:
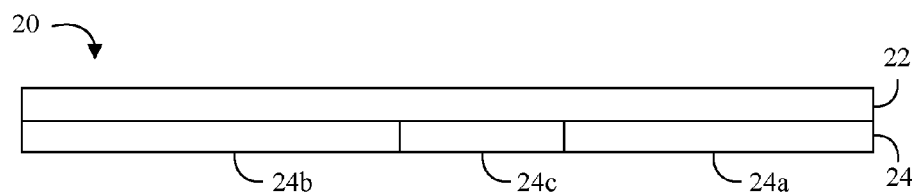
FIG. 2B is a block diagram of an example of the flexible display assembly according to the embodiment of FIG. 2A.

Turning now to FIGS. 2A and 2B, embodiments of a flexible display assembly 20 may include a flexible display 22 and a backplane 24 coupled to the flexible display 22. Advantageously, at least a portion of the backplane 24 comprises a super elastic sheet 24c. For example, the super-elastic sheet 24c may include a super-elastic metal alloy such as, for example, nickel titanium/nitinol. The backplane 24 may also include a first rigid sheet metal portion 24a, a second rigid sheet metal portion 24b, and the super-elastic sheet 24c joined between the first and second rigid sheet metal portions 24a and 24b. For example, the first and second rigid sheet metal portions 24a and 24b may include stainless steel sheet metal and/or aluminum sheet metal.

Figure 3A:
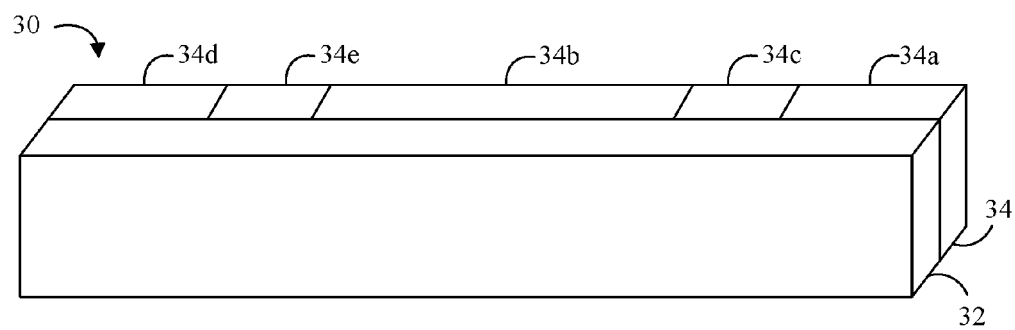
FIG. 3A is an illustrative perspective view of an example of another flexible display assembly according to an embodiment.
Figure 3B:
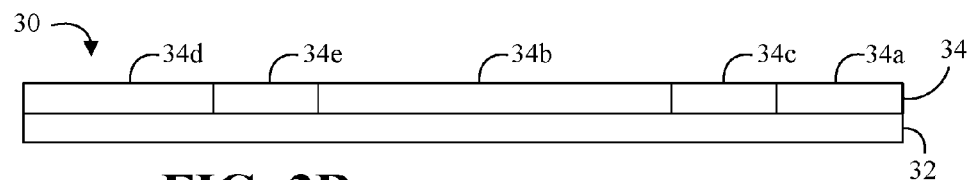
FIG. 3B is a block diagram of an example of the flexible display assembly according to the embodiment of FIG. 3A.

Turning now to FIGS. 3A and 3B, embodiments of a flexible display assembly 30 may include a flexible display 32 and a backplane 34 coupled to the flexible display 32. Advantageously, at least a portion of the backplane 34 comprises a super elastic sheet. For example, the backplane 34 may include a first rigid sheet metal portion 34a, a second rigid sheet metal portion 34b, and a first super-elastic sheet 34c joined between the first and second rigid sheet metal portions 34a and 34b. The backplane 34 may further include a third rigid sheet metal portion 34d and a second super-elastic sheet 34e joined between the second and third rigid sheet metal portions 34b and 34d. For example, the super-elastic sheets 34c and 34e may include a super-elastic metal alloy such as, for example, nickel titanium/nitinol. The first, second, and third rigid sheet metal portions 34a, 34b, and 34d may include stainless steel sheet metal and/or aluminum sheet metal.

Turning now to FIGS. 4A and 4B, embodiments of a hinge apparatus 40 for a flexible display may include a cylinder 42 including a torque engine and defining a bend radius for the flexible display which is greater than or equal a minimum bend radius of the flexible display. A rigid sheet 44 may be coupled to the cylinder 42, the rigid sheet 44 to support folding the flexible display.

Turning now to FIGS. 5A and 5B, embodiments of a support structure 50 for a flexible display may include a back plate 52 and an arm 54 coupled to the back plate 52 to define a channel to slidably receive the rigid sheet 44 in the channel. The support structure 50 may further include another arm 56 coupled to the back plate 52 to define another channel on the opposite side of the back plate 52 to capture the rigid sheet 44 in between the channels and guide the movement of the rigid sheet 44 relative to the flexible display.

Turning now to FIGS. 6 and 7, embodiments of another hinge apparatus 60 for a flexible display may include a cylinder 62 and a rigid sheet 64 coupled to the cylinder 62. The rigid sheet 64 may include a relatively narrower portion proximate to the cylinder 62 and relatively wider wing portions distal to the cylinder 62. Embodiments of a support structure 70 for flexible display may include a back plate 72 and a pair of opposed rigid arms 74 and 76 to define a channel to receive the rigid sheet 64. The support structure 70 may include a first stop 78 positioned along the channel to inhibit the rigid sheet 64 from sliding beyond the first stop 78 and a second stop 79 positioned along the channel to inhibit the rigid sheet 64 from sliding beyond the second stop 79.

Turning now to FIG. 8, embodiments of a support assembly 80 for a flexible display assembly 81 may include a hinge 82 including a torque engine and defining a bend radius for the flexible display assembly 81 which is greater than or equal a minimum bend radius of the flexible display assembly 81. The hinge 82 may include a rigid sheet 83 coupled to the hinge 82, the rigid sheet 83 to support folding the flexible display assembly 81. For example, the hinge 82 may incorporate elements from the hinge apparatus 40 from FIGS. 4A and 4B or the hinge apparatus 60 from FIG. 6. The support assembly 80 may further include a support 84 to support an outer portion of the flexible display assembly 81. For example, the support 84 may incorporate elements from the support structure 50 from FIGS. 5A and 5B or the support structure 70 from FIG. 7. The support 84 may be coupled the flexible display assembly 81 with no portion of the support 84 extending beyond an outer edge of the flexible display assembly 81, providing and edgeless or frameless appearance for the flexible display assembly 81. The support 84 may define a channel 85 to slidably receive the rigid sheet 83 and the support assembly 80 may include the rigid sheet 83 received within the channel 85. As the flexible display assembly 81 is folded around the hinge 82, the rigid sheet 83 can move back and forth in the channel 85 while the support 84 provides rigid support to the outer portion of the flexible display assembly 81.

Turning now to FIGS. 9A and 9B, embodiments of a channel support 90 for a flexible display may include a disc 92 to define a bend radius for the flexible display that is greater than or equal a minimum bend radius of the flexible display. A rigid arm 94 may be coupled to the disc 92. The rigid arm 94 may define a C channel to slidably receive the flexible display.

Figure 10A:
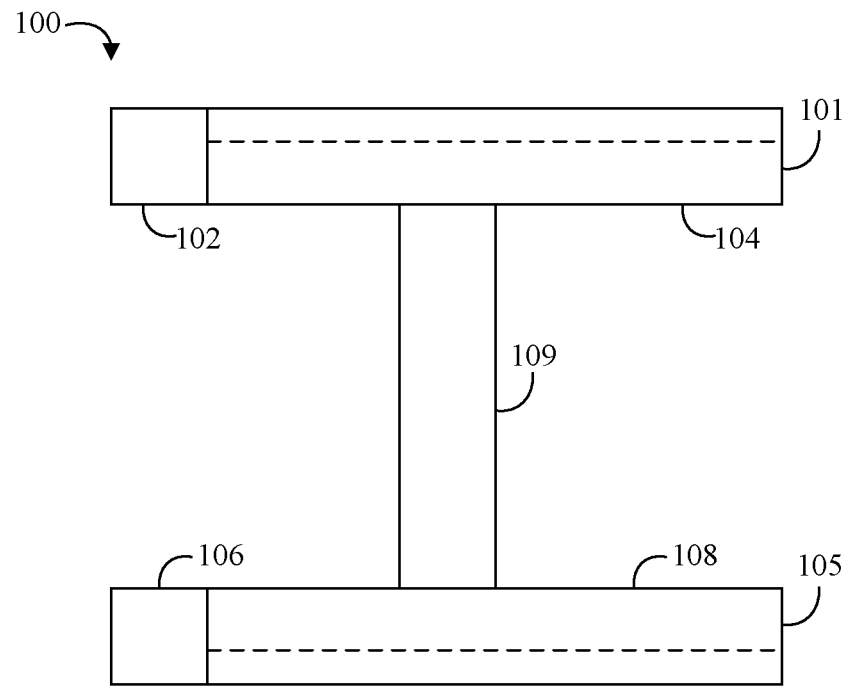
FIG. 10A is an illustrative top view of an example of a support structure according to an embodiment.
Figure 10B:
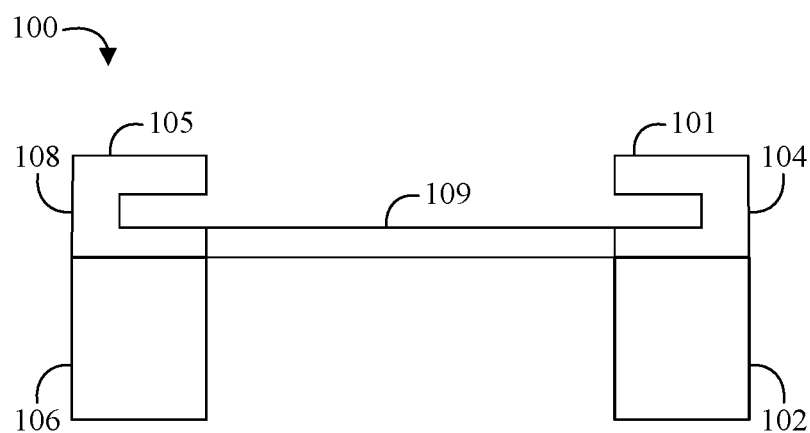
FIG. 10B is a front view of an example of the support structure according to the embodiment of FIG. 10A.

Turning now to FIGS. 10A and 10B, embodiments of a support structure 100 for a flexible display may include a first channel support 101 having a first disc 102 defining a bend radius for the flexible display and a first rigid arm 104 coupled to the first disc 102. The first rigid arm 104 may define a channel to receive a first edge of the flexible display. The support structure 100 may further include a second channel support 105 having a second disc 106 defining the same bend radius for the flexible display and a second rigid arm 108 coupled to the second disc 106. The second rigid arm 108 may define a channel to receive a second edge of the flexible display opposite to the first edge of the flexible display. For example, the first channel support 101 may incorporate elements from the channel support 90 from FIGS. 9A and 9B. The second channel support 105 may be mirrored structurally with respect to the first channel support 101. The support structure 100 may further include a rigid link 109 coupled between the first channel support 101 and the second channel support 105 to keep the first and second channel supports 101 and 105 aligned and in phase.

Figure 11A:
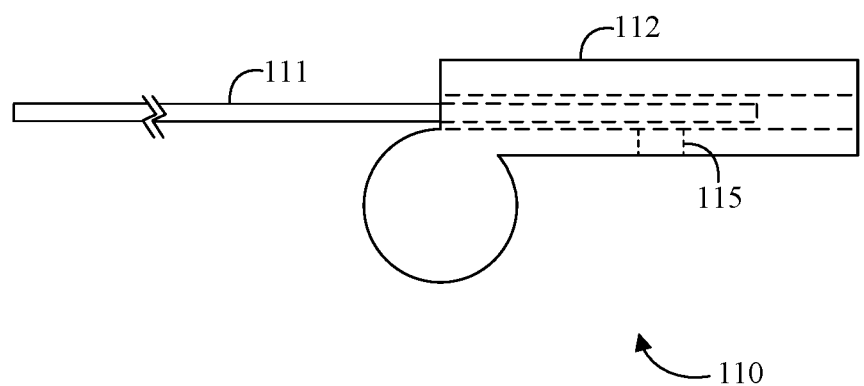
FIG. 11A is a side view of an example of another support assembly for a flexible display according to an embodiment.
Figure 11B:
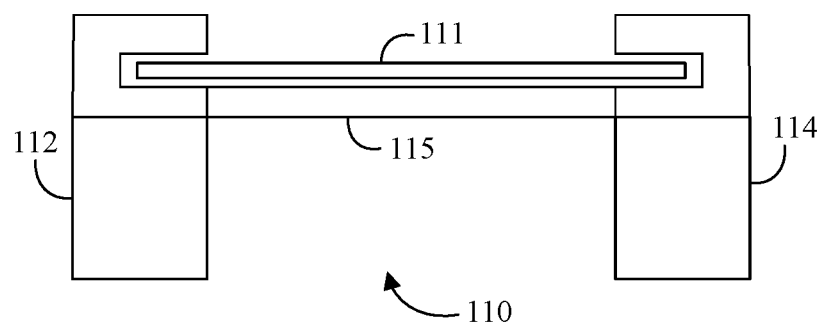
FIG. 11B is a front view of an example of the support assembly according to the embodiment of FIG. 11A.

Turning now to FIGS. 11A and 11B, embodiments of a support assembly 110 for a flexible display assembly (e.g. including a display backplane) 111 may include a first channel support 112 defining a bend radius for the flexible display assembly 111 that is greater than or equal to a minimum bend radius of the flexible display assembly 111 and a first channel in the first channel support 112 to receive a first edge of the flexible display assembly 111, and a second channel support 114 to provide the bend radius and a second channel in the second channel support 114 to receive a second edge of the flexible display assembly 111 opposite to the first edge of the flexible display assembly 111. The support assembly 110 may further include a rigid link 115 coupled between the first and second channel supports 112 and 114.

Figure 12A:
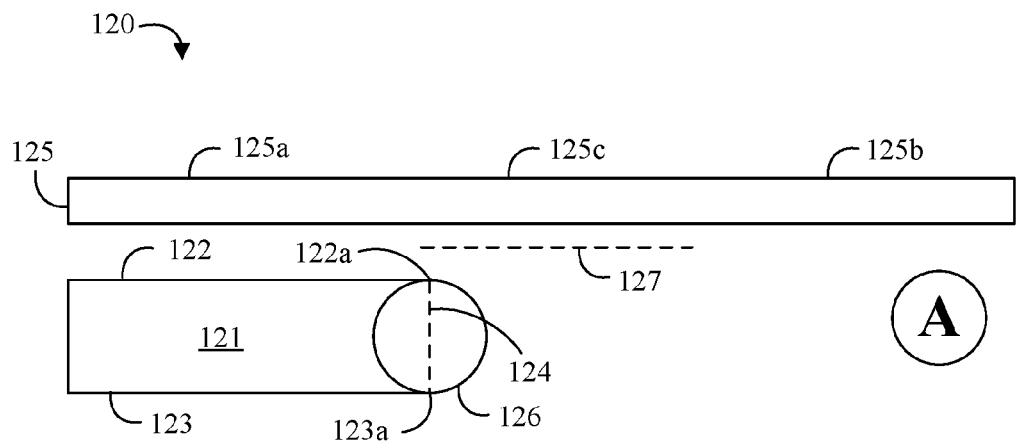
FIG. 12A is a block diagram of an example of a processing device according to an embodiment.
Figure 12B:
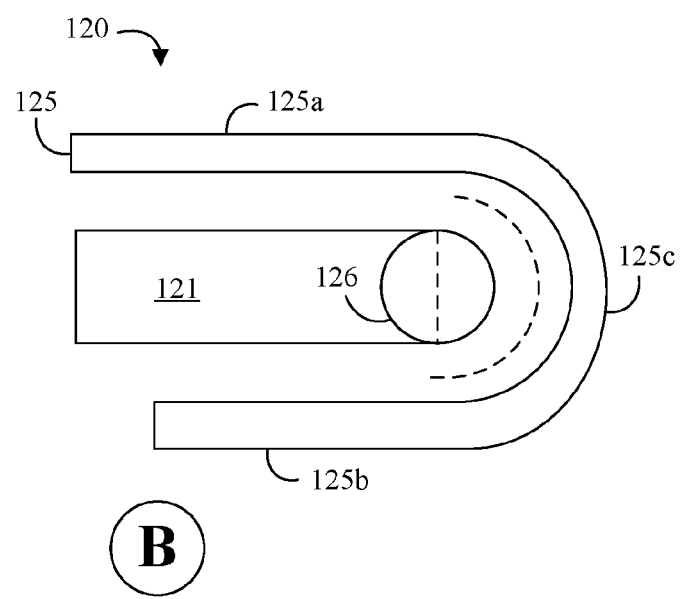
FIG. 12B is another block diagram of an example of the processing device according to the embodiment of FIG. 12A.

Turning now to FIGS. 12A and 12B, embodiments of a portable processing device 120 may include a device body 121 having a front surface 122, a back surface 123, and an end surface 124 along aligned respective first sides 122a and 123a of the front and back surfaces 122 and 123 of the device body 121. A flexible display 125 may be coupled to the front surface 122 of the device body 121 at an inner portion 125a of the flexible display 125, wherein an outer portion 125b of the flexible display 125 extends beyond the end surface 124 of the device body, and a bend portion 125c of the flexible display 125 may be positioned between the inner portion 125a of the flexible display 125 and the outer portion 125b of the flexible display 125. Advantageously, a hinge 126 may be coupled to the device body 121 proximate to the end surface 124 to support the outer portion 125b of the flexible display 125 through a range of motion from a first position wherein the outer portion 125b of the flexible display 125 is substantially coplanar with the inner portion 125a of the flexible display 125 (e.g. see reference point A in FIG. 12A) and a second position wherein the outer portion 125b of the flexible display 125 is folded around the end surface 124 of the device body 121 (e.g. see reference point B in FIG. 12B). A super-elastic sheet 127 may be positioned to support the flexible display 125 at least in a first region corresponding to the bend portion 125c of the flexible display 125. For example, in some embodiments the super-elastic sheet 127 may include a super-elastic metal alloy such as, for example, nickel titanium/nitinol.

Advantageously, in some embodiments the hinge 126 may provide a bend radius that is greater than or equal to a minimum bend radius of the flexible display 125. For example, the hinge 126 may include a cylinder having a circular or oval cross section. Alternatively, other surface structures may be used for the hinge to support the desired bend radius (e.g. a multi-sided polygon cross section). In some embodiments, the hinge 126 may further include a rigid sheet coupled to the cylinder to support the flexible display 125 in at least a portion of the outer portion 125b of the flexible display 125. Advantageously, the processing system 120 may further include a rigid support coupled to the outer portion of the flexible display, the rigid support including a slot to slidably receive the rigid sheet. In some embodiments the rigid support may include a first stop positioned along the slot to inhibit the rigid sheet from sliding beyond the first stop in the first position and a second stop positioned along the slot to inhibit the rigid sheet from sliding beyond the second stop in the second position.

Moreover, in some embodiments the super-elastic sheet 127 may extend to support the outer portion 125b of the flexible display 125. For example, in some embodiments the hinge may further include a first channel support to provide a bend radius that is greater than or equal to a minimum bend radius of the flexible display 125 and a first channel in the first channel support to receive a first edge of the flexible display 125 and a first edge of the super-elastic sheet 127, and a second channel support to provide the bend radius and a second channel in the second channel support to receive a second edge of the flexible display 125 opposite to the first edge of the flexible display 125 and a second edge of the super-elastic sheet 127. In some embodiments the super-elastic sheet 127 may be anchored to the device body 121 proximate to the end surface 124 of the device body 121. Advantageously, some embodiments of the processing system 120 may further include a rigid link coupled between the first and second channel supports.

Figure 13A:
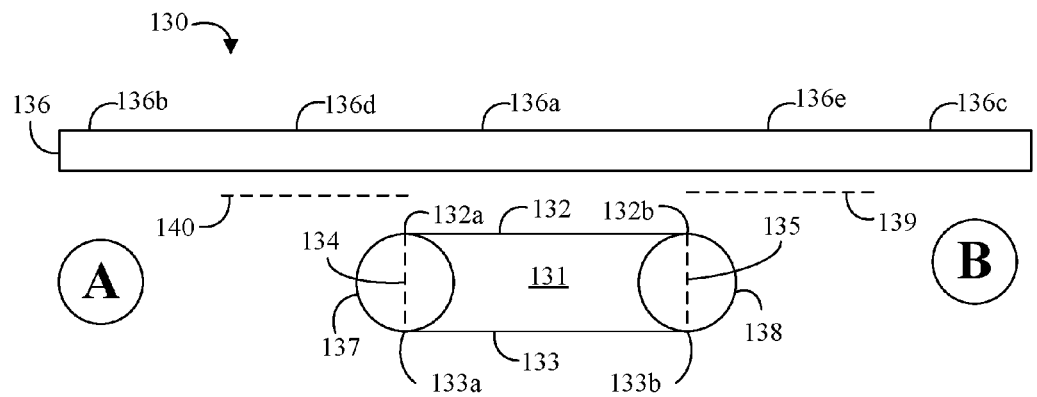
FIG. 13A is a block diagram of an example of another processing device according to an embodiment.
Figure 13B:
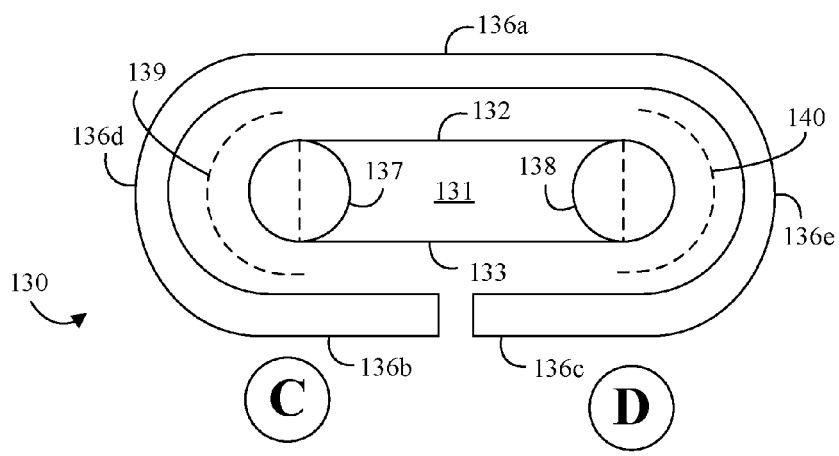
FIG. 13B is another block diagram of an example of the processing device according to the embodiment of FIG. 13A.

Turning now to FIGS. 13A and 13B, a portable processing device 130 may include a device body 131 having a front surface 132, a back surface 133, a first end 134 of the device body 131 along aligned respective first sides 132a and 133a of the front and back surfaces 132 and 133 of the device body 131, and a second end 135 of the device body 131 opposite to the first end 134 of the device body 131 along aligned respective second sides 132b and 133b of the front and back surfaces 132 and 133.

A flexible display 136 may be coupled to the front surface 132 of the device body 131 at an inner portion 136a of the flexible display 136, wherein a first outer portion 136b of the flexible display 136 extends beyond the first end 134 of the device body 131, wherein a second outer portion 136c of the flexible display 136 extends beyond the second end 135 of the device body 131, a first bend portion 136d of the flexible display 136 is positioned between the inner portion 136a of the flexible display 136 and the first outer portion 136b of the flexible display 136, and wherein a second bend portion 136e of the flexible display 136 is positioned between the inner portion 136a of the flexible display 136 and the second outer portion 136c of the flexible display 136.

A first hinge 137 may be coupled to the device body 131 proximate to the first end 134 of the device body 131 to support the first outer portion 136b of the flexible display 136 through a range of motion from a first position A (see FIG. 13A). The illustrated first outer portion 136b of the flexible display 136 is substantially coplanar with the inner portion 136a of the flexible display 136 and a second position C (see FIG. 13B), wherein the first outer portion 136b of the flexible display 136 is folded backward around the first end 134 of the device body 131.

A second hinge 138 may be coupled to the device body 131 proximate to the second end 135 of the device body 131 to support the second outer portion 136c of the flexible display 136 through a range of motion from a third position B (see FIG. 13A). The illustrated second outer portion 136c of the flexible display 136 is substantially coplanar with the inner portion 136a of the flexible display 136 and a fourth position D (see FIG. 13B), wherein the second outer portion 136c of the flexible display 136 is folded backward around the second end 135 of the device body 131.

Advantageously, a first super-elastic sheet 139 may be positioned to support the flexible display 136 at least in a first region corresponding to the first bend portion 136d of the flexible display 136, and a second super-elastic sheet 140 may be positioned to support the flexible display 136 at least in a second region corresponding to the second bend portion 136e of the flexible display 136. For example, the first and second super-elastic sheets 139 and 140 may each comprise a super-elastic metal alloy. Moreover, the first and second super-elastic sheets 139 and 140 may each comprise nickel titanium/nitinol.

With reference to FIGS. 13A and 13B, a first bend radius supported by the first hinge 137 may be substantially the same as a second bend radius supported by the second hinge 138. The flexible display 136 may have a length such that there is no overlap between the first outer portion 136b of the flexible display 136 and the second outer portion 136c of the flexible display 136 along the back surface 133 of the device body 131 and both the first outer portion 136b and the second outer portion 136c of the flexible display 136 can lie flat against the back surface 133 of the device body 131.

Figure 14:
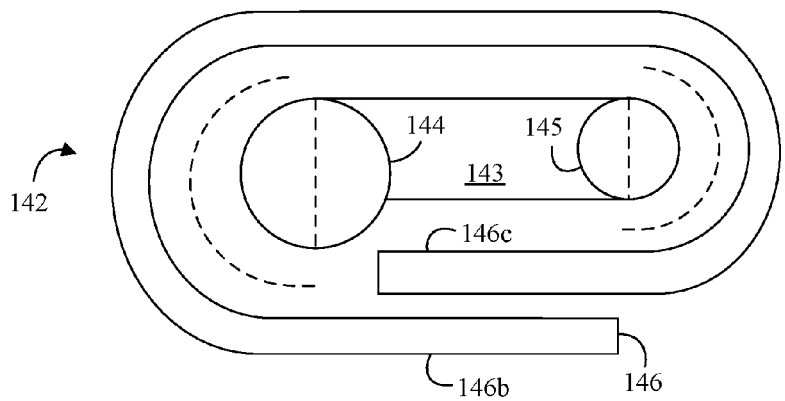
FIG. 14 is a block diagram of an example of another processing device according to an embodiment.
Figure 15A:
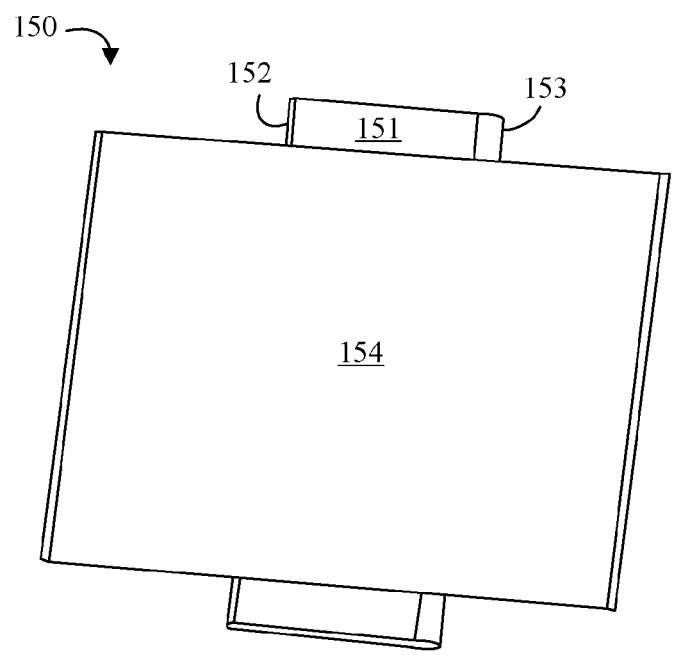
FIG. 15A is a front perspective view of an example of another processing device according to an embodiment.
Figure 15B:
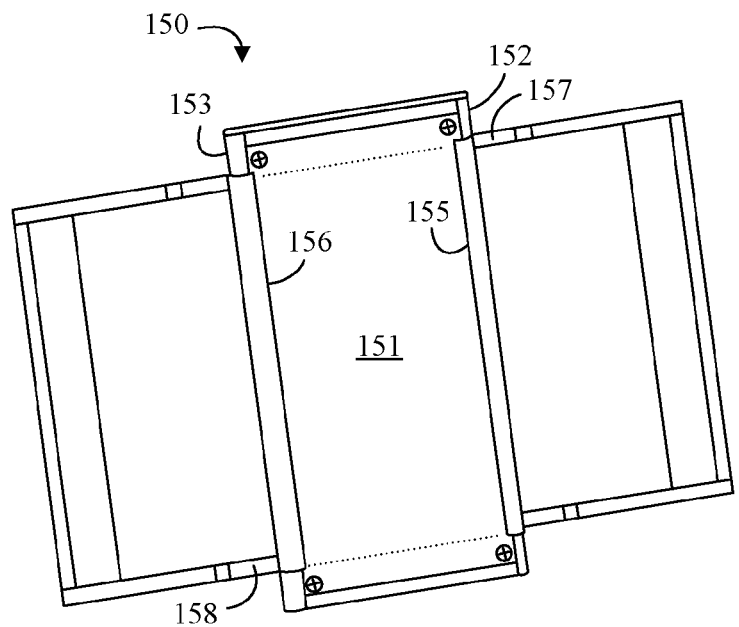
FIG. 15B is a rear perspective view of an example of the processing device according to the embodiment of FIG. 15A.
Figure 15C:
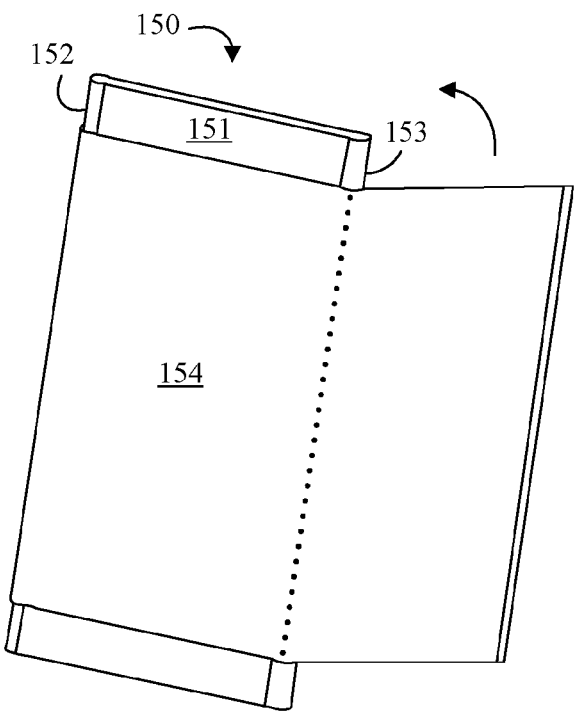
FIG. 15C is another front perspective view of an example of the processing device according to the embodiment of FIG. 15A.
Figure 15D:
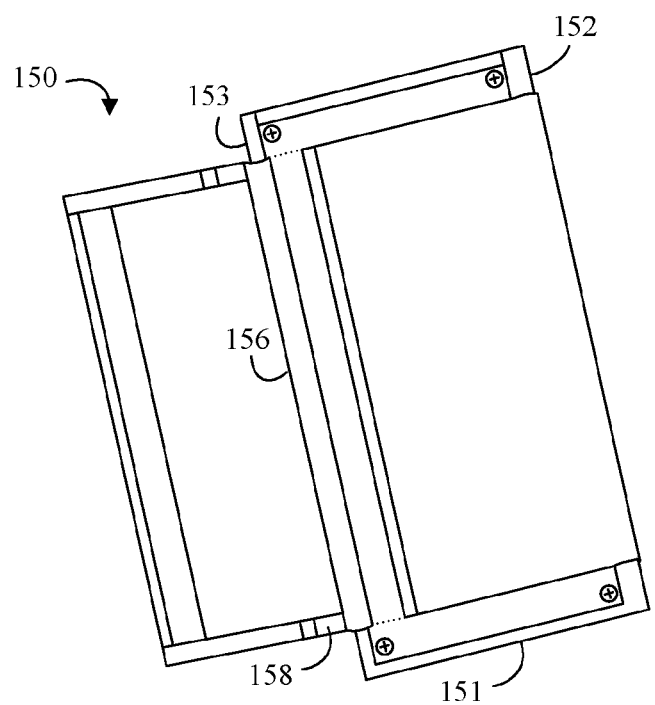
FIG. 15D is another rear perspective view of an example of the processing device according to the embodiment of FIG. 15A.

Turning now to FIG. 14, embodiments of a portable processing device 142 may include a device body 143 with a first hinge 144 and a second hinge 145, wherein a first bend radius supported by the first hinge 144 is different from a second bend radius supported by the second hinge 145. A flexible display 146 may have a length such that there is an overlap between first and second outer portions 146b and 146c of the flexible display 146 when folded along a back surface of the device body 143. For example, the different bend radii supported by the first and second hinges 144 and 145 may support a substantially flat overlap between the first outer portion 146b of the flexible display 146 and the second outer portion 146c of the flexible display 146 along the back surface of the device body 143. A first pivot point for the first hinge 144 may be offset with respect to a second pivot point of the second hinge 145.

Advantageously, in some embodiments the first hinge may further include a hinge to provide a first bend radius which is greater than or equal to a minimum bend radius of the flexible display and the second hinge may further include a hinge to provide a second bend radius which is greater than or equal to the minimum bend radius of the flexible display. For example, the first hinge may further include a first cylinder to provide the first bend radius that is greater than or equal to a minimum bend radius of the flexible display, and the second hinge may further include a second cylinder to provide the second bend radius that is greater than or equal to the minimum bend radius of the flexible display. For example, the hinge cylinders may have a circular or oval cross section. Alternatively, other surface structures may be used for the hinges to support the desired bend radii (e.g. multi-sided polygon cross sections).

In some embodiments, the first hinge may further include a first rigid sheet coupled to the first cylinder to support the flexible display in at least a portion of the first outer portion of the flexible display, and the second hinge may further include a second rigid sheet coupled to the second cylinder to support the flexible display in at least a portion of the second outer portion of the flexible display. Advantageously, some embodiments of a portable processing device may further include a first rigid support coupled to the first outer portion of the flexible display, the first rigid support including a first slot to slidably receive the first rigid sheet, and a second rigid support coupled to the second outer portion of the flexible display, the second rigid support including a second slot to slidably receive the second rigid sheet. The first rigid support may include a first stop positioned along the first slot to inhibit the first rigid sheet from sliding beyond the first stop in the first position and a second stop positioned along the first slot to inhibit the first rigid sheet from sliding beyond the second stop in the second position, and the second rigid support may include a third stop positioned along the second slot to inhibit the second rigid sheet from sliding beyond the second stop in the third position and a fourth stop positioned along the second slot to inhibit the second rigid sheet from sliding beyond the fourth stop in the fourth position.

Advantageously, in some embodiments of a portable processing device the first super-elastic sheet may extend to support the first outer portion of the flexible display and the first hinge may further include a first channel support to provide a first bend radius that is greater than or equal to a minimum bend radius of the flexible display and a first channel in the first channel support to receive a first edge of the flexible display and a first edge of the first super-elastic sheet. The first hinge may further include a second channel support to provide the first bend radius and a second channel in the second channel support to receive a second edge of the flexible display opposite to the first edge of the flexible display and a second edge of the first super-elastic sheet. Advantageously, in some embodiments of a portable processing device the second super-elastic sheet may extend to support the second outer portion of the flexible display and the second hinge may further include a third channel support to provide a second bend radius that is greater than or equal to the minimum bend radius of the flexible display and a third channel in the third channel support to receive a third edge of the flexible display and a third edge of the second super-elastic sheet. The second hinge may further include a fourth channel support to provide the second bend radius and a fourth channel in the fourth channel support to receive a fourth edge of the flexible display opposite to the third edge of the flexible display and a fourth edge of the second super-elastic sheet.

Advantageously, in some embodiments of a processing device the first super-elastic sheet may be anchored to the device body proximate to the first end of the device body and the second super-elastic sheet may be anchored to the device body proximate to the second end of the device body. Advantageously, some embodiments of a processing device may further include a first rigid link coupled between the first and second channel supports, and a second rigid link coupled between the third and fourth channel supports.

Folding displays may provide compelling user experience form factors. However, conventional hinge mechanisms to control the display's folding action may be problematic due to, for example, the limited physical space available with a small form factor footprint. Advantageously, some embodiments may provide a thin, super-elastic hinge mechanism and support structure for a foldable display including, for example, a 3-in-1 (e.g. phone/tablet/desktop or convertible computer) performance computing device.

Embodiments including a backward folding OLED display can provide useful portable electronic devices. In general, folding OLED displays can only be bent in a specific orientation, need to be fully supported on the back of the panel, and need to be protected to minimize risk of compromising the hermetic seals. For example, particular device user experience requirements may dictate that the panel be presented in specified orientations with adequate support for user touch experience. Conventional hinges do not support this panel configuration. Advantageously, some embodiments may provide a hinge that supports and fulfills the entire panel mechanical and user experience requirements for a touch enabled device in a very thin form factor. Advantageously, some embodiments may provide a foldable display mechanism for controlling the motion of a foldable display for a small form factor, 3-in-1 device (e.g. phone/tablet/desktop or convertible computer). Advantageously, some embodiments of a foldable display mechanism may use super-elastic metal (e.g. nickel titanium or nitinol) and related support structures for a foldable display.

With reference to FIGS. 15A to 15D, a portable processing device 150 may include a device body 151 having a front surface, a back surface, a first end 152 of the device body 151 along aligned respective first sides and of the front and back surfaces of the device body 151, and a second end 153 of the device body 151 opposite to the first end 152 of the device body 151 along aligned respective second sides of the front and back surfaces.

A flexible display 154 may be coupled to the front surface of the device body 151 at an inner portion of the flexible display 154, wherein a first outer portion of the flexible display 154 extends beyond the first end 152 of the device body 151, wherein a second outer portion of the flexible display 154 extends beyond the second end 153 of the device body 151, a first bend portion of the flexible display 154 is positioned between the inner portion of the flexible display 154 and the first outer portion of the flexible display 154, and wherein a second bend portion of the flexible display 154 is positioned between the inner portion of the flexible display 154 and the second outer portion of the flexible display 154.

A first hinge 155 may be coupled to the device body 151 proximate to the first end 152 of the device body 151 to support the first outer portion of the flexible display 154 through a range of motion from a first position (see FIG. 15A) wherein the first outer portion of the flexible display 154 is substantially coplanar with the inner portion of the flexible display 154 and a second position (see FIG. 15C) wherein the first outer portion of the flexible display 154 is folded backward around the first end 152 of the device body 151. In some embodiments of the portable processing device 150, the first hinge 155 may further support the first outer portion of the flexible display 154 through a range of motion including a first extended position wherein the first outer portion of the flexible display 154 is folded forward beyond the first coplanar position.

A second hinge 156 may be coupled to the device body 151 proximate to the second end 153 of the device body 151 to support the second outer portion of the flexible display 154 through a range of motion from a third position (see FIG. 15A) wherein the second outer portion of the flexible display 154 is substantially coplanar with the inner portion of the flexible display 154 and a fourth position (see FIG. 15C) wherein the second outer portion of the flexible display 154 is folding backward around the second end 153 of the device body 151. In some embodiments of the portable processing device 150, the second hinge 156 may further support the second outer portion of the flexible display 154 through a range of motion including a second extended position wherein the second outer portion of the flexible display 154 is folded forward beyond the third coplanar position.

Advantageously, a first super-elastic sheet 157 may be positioned to support the flexible display 154 at least in a first region corresponding to the first bend portion of the flexible display 154, and a second super-elastic sheet 158 may be positioned to support the flexible display 154 at least in a second region corresponding to the second bend portion of the flexible display 154. For example, the first and second super-elastic sheets 157 and 158 may each comprise a super-elastic metal alloy. For example, the first and second super-elastic sheets 157 and 158 may each comprise nickel titanium. For example, the first and second super-elastic sheets 157 and 158 may each comprise nitinol.

Advantageously, embodiments of the processing device 150 may include the hinges 155 and 156 and related structures to provide a touch enabled user experience and foldable display panel mechanical requirements in a 3-in-1 portable device. Embodiments of the processing device 150 may utilize cylinders to create a constant known radius, a super-elastic material that will support the strains in bending around the cylinder, and a slider mechanism that limits the hinge motion and provides torque during hinge operation. In addition, in some embodiments of the processing device 150 the super elastic-material may create a constant size, very thin, rigid back plane required for the flexible display mechanical support and user experience. Advantageously, embodiments of the hinge may be simple to manufacture, thin, and satisfy the panel mechanical and user experience requirements.

For example, embodiments of the hinges 155 and 156 may implement elements of the hinge apparatus and support structures described above in connection with FIG. 4A through FIG. 8. For example, the support assembly may utilize a rigid stainless steel structure and a foldable super-elastic base structure. Advantageously, the super elastic alloy allows the display 154 to fold around the device 150 at the hinges 155 and 156, and the stainless structures provide required user experience display rigidity. Advantageously, embodiments of a hinge slider support may compensate for the length of the flexible display as the hinge rotates. For example, embodiments of a hinge device may provide locating, torque, and strength to control the super elastic alloy during bending, may integrate torque engines to control panel positions, and may compensate for length changes generated by wrapping around the device.

Figure 16:
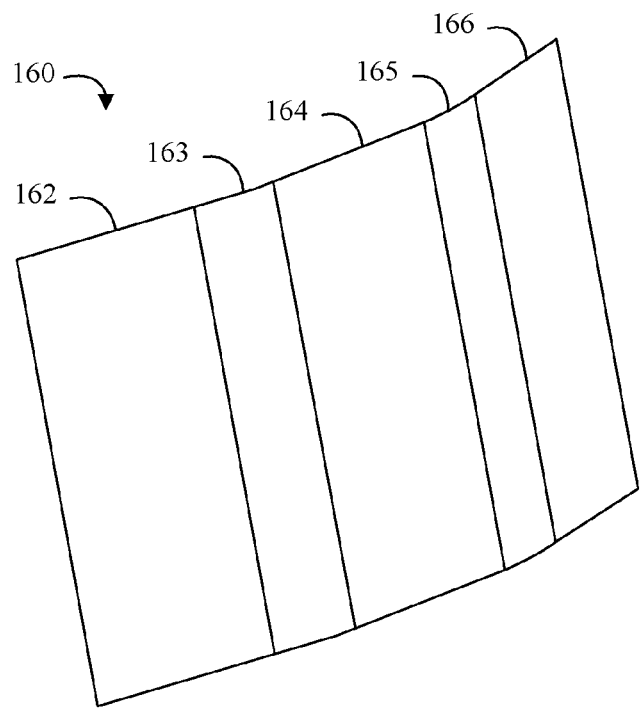
FIG. 16 is a perspective view of an example of another backplane for a flexible display according to an embodiment.

Turning now to FIG. 16, embodiments of a backplane 160 for a flexible display may include first, second, and third rigid stainless steel sheet metal sections 162, 164, and 166. The backplane 160 may further include a first flexible nitinol sheet metal section 163 joined between the first and second stainless steel sheet metal sections 162 and 164. The backplane 160 may further include a second flexible nitinol sheet metal section 165 joined between the first and second stainless steel sheet metal sections 164 and 166. Advantageously, in some embodiments the nitinol thickness may help provide an opening force for the hinge. For example, in some embodiments a relatively small change in the thickness of the nitinol may provide a ten times increase in opening force of the hinge. Advantageously, in some embodiments the thickness of the nitinol may be precisely selected to provide a desired opening force of the hinge in accordance with a desired user tactile experience.

Figure 17:
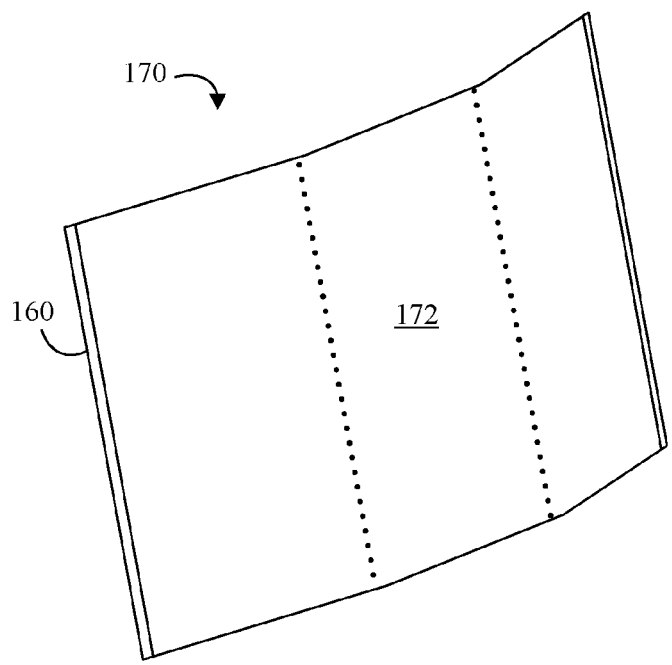
FIG. 17 is a perspective view of an example of another flexible display assembly according to an embodiment.

Turning now to FIG. 17, embodiments of a flexible display assembly 170 may include a flexible OLED display 172 affixed to an embodiment of the backplane 160 from FIG. 16. Advantageously, two sections 163 and 165 of the backplane 160 include flexible nitinol sheet metal to support bending the flexible display assembly 170 through a range of motion at those flexible sections 163 and 165. In some embodiments of the flexible display assembly 170, the backplane 160 may be the same length as the OLED display 172 or may be slightly short than the OLED display 172 advantageously providing an edgeless or frameless appearance.

Figure 18A:
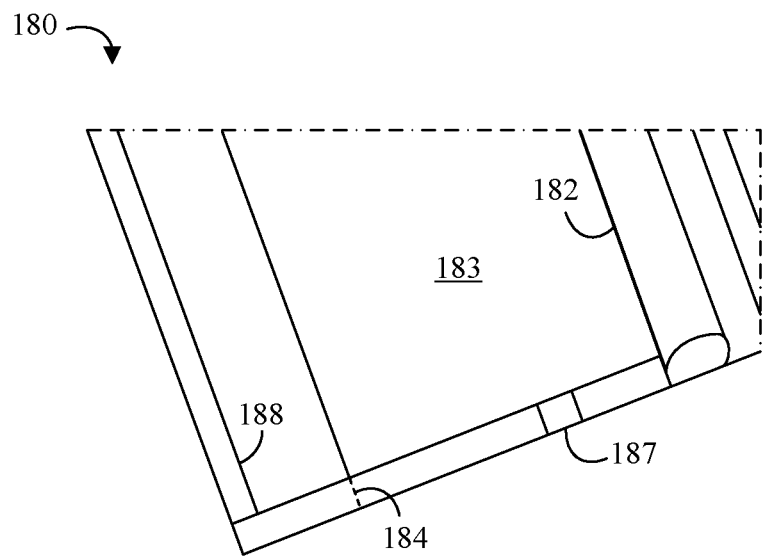
FIG. 18A is an enlarged, cutaway perspective view of an example of a support assembly for a flexible display according to an embodiment.
Figure 18B:
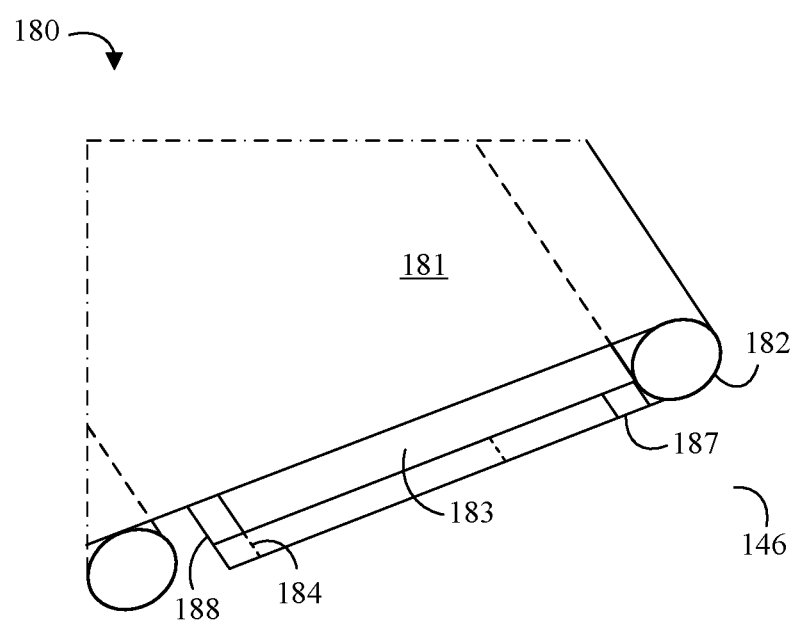
FIG. 18B is another enlarged, cutaway perspective view of an example of a support assembly for a flexible display according to an embodiment.

Turning now to FIGS. 18A and 18B, embodiments of a hinge support assembly 180 for a flexible display 181 may include a cylinder 182, a rigid sheet 183 coupled to the cylinder 182, wherein the rigid sheet 183 includes a wing portion 184 distal to the cylinder 182. The hinge support assembly 180 further includes various slider support structures. For example, the slider support structures may be coupled to a rigid stainless section of a backplane for the flexible display 181. The slider support structures may include a slider arm 186 that defines a channel to slidably receive the wing portion 184 of the rigid sheet 183. The slider support structures may further include a first stop 187 to block the wing portion 184 from sliding past a position of the first stop 187 along the slider arm 186. The slider support structures may further include a second stop 188 to block the wing portion 184 or the rigid sheet 183 itself from sliding past a position of the second stop 188 along the slider arm 186. Corresponding slider support structures may be provided for the opposite edge of the flexible display 181. Similarly, the hinge support assembly for the other side of the flexible display may include similar components including a cylinder with a rigid sheet coupled thereto, and a slider support structure to slidably capture a wing portion of the rigid sheet between two stops. Advantageously, in some embodiments the cylinder may incorporate sensors to detect when the flexible display 181 is open or closed. For example, such sensors may enable a system using the hinge assembly 180 to sense when to turn on and off portions of the flexible display 181 when converting from a phablet configuration to a tablet configuration and vice versa.

Advantageously, the display 181 itself may have no direct contact with the slider mechanism. In some embodiments, the display 181 may advantageously appear to have no support structure visible beyond an edge of the display 181 (e.g. an edgeless or frameless appearance). In some embodiments the slider structures may contact each other with hard stops, advantageously holding the display 181 tightly around the hinge cylinder in the closed position with the hard stop preventing excess strain and providing a hard stop in the open position to hold the display 181 in a flat position.

Figure 19A:
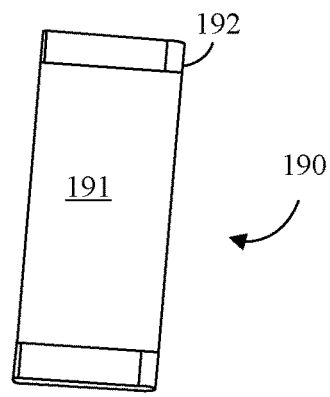
FIG. 19A is a front perspective view of an example of another processing device according to an embodiment, in a phone configuration.
Figure 19B:
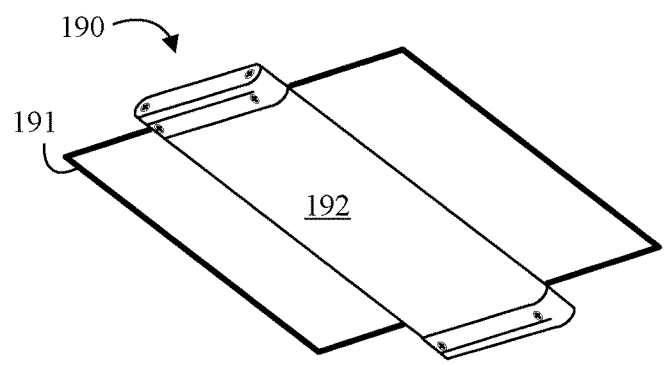
FIG. 19B is a rear perspective view of an example of the processing device according to the embodiment of FIG. 19A, in a tablet configuration.
Figure 19C:
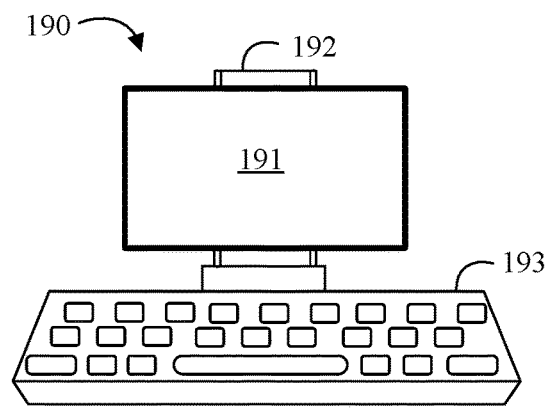
FIG. 19C is a front, partial perspective view of an example of the processing device according to the embodiment of FIG. 19A, in a convertible computer configuration.
Figure 19D:
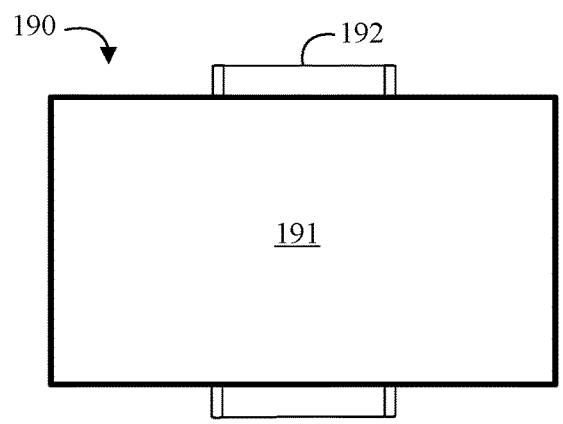
FIG. 19D is a front view of an example of the processing device according to the embodiment of FIG. 19B.
Figure 19E:
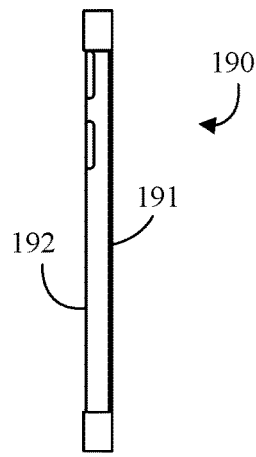
FIG. 19E is a side view of an example of the processing device according to the embodiment of FIG. 19B.
Figure 19F:
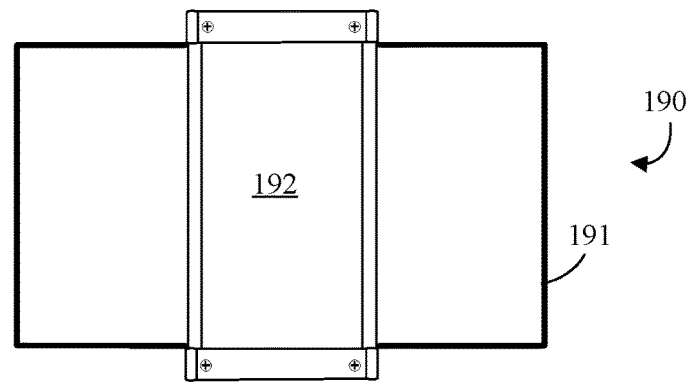
FIG. 19F is a back view of an example of the processing device according to the embodiment of FIG. 19B.

Turning now to FIGS. 19A to 19F, embodiments of a 3-in-1 backward fold device 190 may include a phone configuration (e.g. FIG. 19A), a tablet configuration (FIG. 19B), and a convertible computer configuration (e.g. FIG. 19C). For example, the device 190 includes a flexible display panel 191 that folds around a phablet body 192 to form a phone configuration, retracts from the phablet body 192 to form a tablet configuration, and plugs into a keyboard dock 193 to form a convertible computer configuration. In some embodiments, a 6 inch phone configuration may turn into 10 inch tablet configuration (or e.g., a 7" phablet configuration if utilizing only one hinge assembly).

Figure 20A:
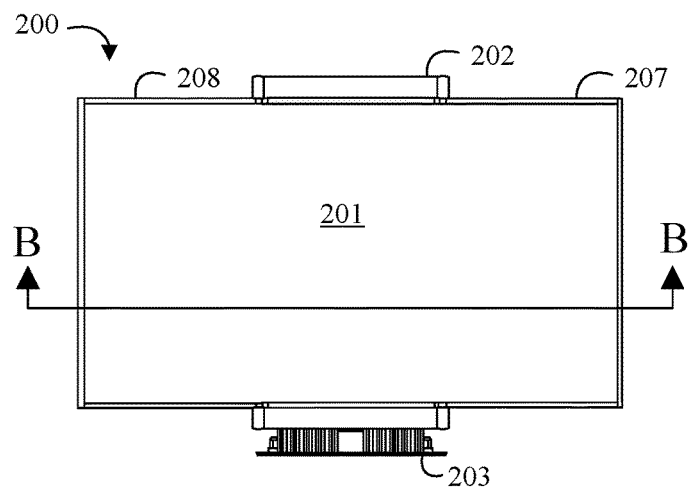
FIG. 20A is a front view of an example of another processing device according to an embodiment.
Figure 20B:
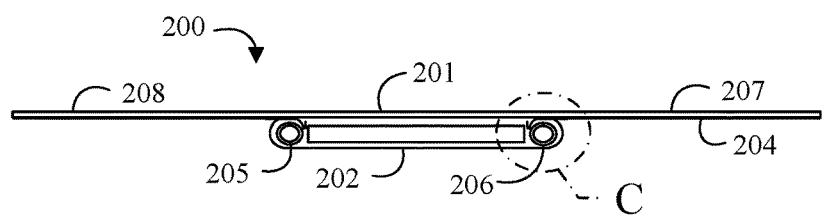
FIG. 20B is a sectional view of an example of the processing device according to the embodiment of FIG. 20A taken along line B-B in FIG. 20A.
Figure 20C:
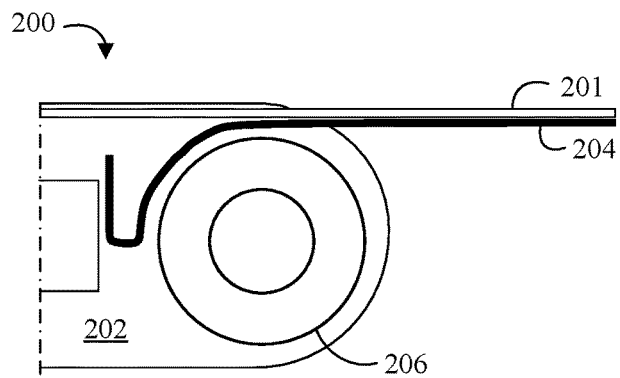
FIG. 20C is an enlarged view of an example of the area C from FIG. 20B.

Turning now to FIGS. 20A to 20C, embodiments of a processing device 200 may include a backward folding flexible display 201 coupled to a front surface of a device chassis 202. For example, the device 200 may include a detachable module 203, such as a circuit board or a battery module. Advantageously, embodiments of the device 200 may include a very thin, super-elastic metal (nickel-titanium) sheet 204 that may be anchored to the device chassis 202. For example, in some embodiments suitable thicknesses for the sheet 204 may be in the range of 0.025 to 0.2 mm. For example, embodiments of the super-elastic sheet metal structure 204 may act as a living hinge by pivoting around the chassis 202.

Embodiments of the processing device 200 may include a first hinge cylinder 205 supporting a bend radius for the flexible display 201 that is larger than another bend radius of a second hinge cylinder 206, such that a first wing 207 of the flexible display 201 folds flat against a back surface of the chassis 202 and a second wing 208 of the flexible display 201 fold flat against the first wing 207 of the flexible display 201. For example, the first hinge cylinder 205 may have a 6 mm radius barrel and the second hinge cylinder 206 may have a 5 mm radius barrel. Advantageously, embodiments of the super-elastic sheet metal 204 may retain its shape over the life of the device 200 without substantial degradation or mechanical yield. For example, the sheet structure 204 may support the wing 207 of the foldable display 201 when the display 201 is fully extended. A similar super-elastic sheet may be anchored to the other side of the chassis 202 to support the wing 208 of the foldable display 201. In some embodiments, when the display 201 is folded around the hinge cylinder 205 or 206, magnets and/or hook features may be used to secure the display 201 to the chassis 202. For example, some embodiments of the cylinders 205 or 206 may contain friction elements that control intermediate open and/or close configurations for the display wings.

Figure 21A:
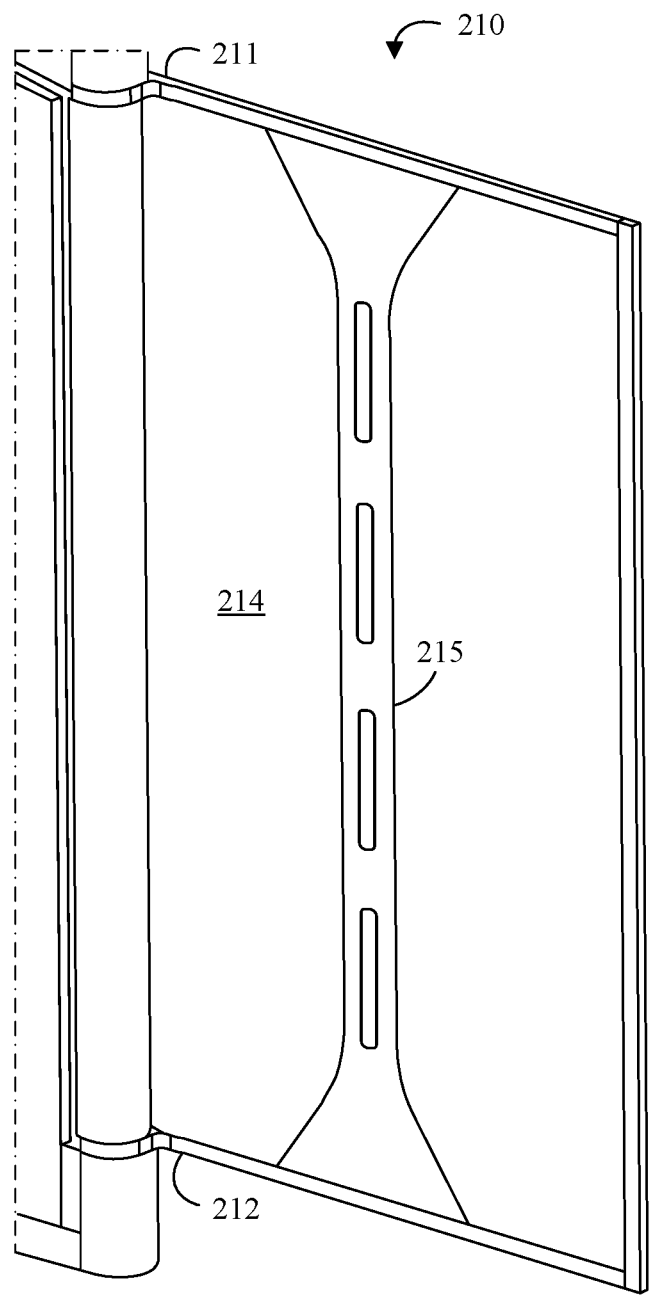
FIG. 21A is a cutaway, rear perspective view of an example of another processing device according to an embodiment.
Figure 21B:
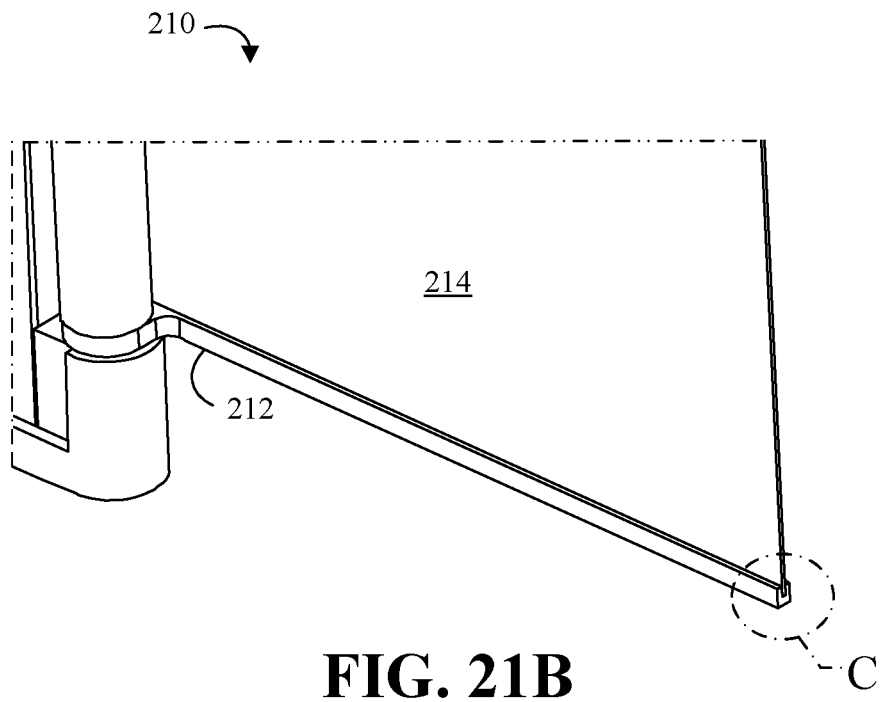
FIG. 21B is an enlarged, cutaway perspective view of an example of the processing device according to the embodiment of FIG. 21A.
Figure 21C:
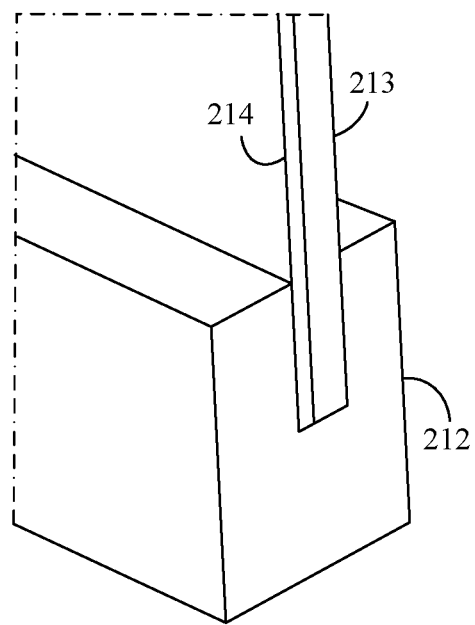
FIG. 21C is another enlarged view of an example of the area C from FIG. 21B.

Turning now to FIGS. 21A to 21C, embodiments of a processing device 210 may include a pair of rotatable channel supports 211 and 212. Each of the rotatable channel supports 211 and 212 may define a channel to receive a flexible display panel 213 and a super-elastic metal backplane 214. Advantageously, the support arms 211 and 212 support the screen 213 and may also contain a c-channel feature that allows relative motion between the foldable display 213 and the NiTi sheet structure 214. For example, the super-elastic sheet may be anchored to the device chassis as described above in connection with FIGS. 20A to 20C. Advantageously, the support arms 211 and 212 may trap the mating parts to keep the folding motion constant throughout the user experience.

For example, embodiments of the rotatable channel supports 211 and 212 may implement elements of the channel support structures described above in connection with FIG. 9A through FIG. 11B. For example, in some embodiments of the device 200, upper and lower channel supports 211 and 212 may be mechanically linked to keep the supports in phase when the foldable screen 213 is in motion. For example, the device 210 may further include a vertical link 215 coupled between the first rotatable channel support 211 and the second rotatable channel support 212. Advantageously, the vertical link 215 may provide backing support for the nitinol sheet 214 and also coordination of movement for the two support arms 211 and 212.

For example, as the display 213 folds around the device chassis, the display 213 gets pulled into the channel of the support arms 211 and 212. Advantageously, a pivot point of the support arms 211 and 212 may be selected to hold the display 213 tight against the turn radius. Without being limited to theory of operation, the super-elastic sheet 214 may act as a shape memory alloy. A phase transition temperature may be set at a relatively low temperature to maintain the super-elastic sheet 214 in one phase. Excess strain may cause a shape memory alloy to change phase. Advantageously, embodiments utilizing nitinol may maintain strain within acceptable design parameters to avoid phase change. For example, neither the material 214 nor the display 213 stretch. Advantageously, embodiments utilizing the nitinol sheet 214 can support the strain around the bend without excess strain.

ADDITIONAL NOTES AND EXAMPLES

Example 1 includes a support assembly for a flexible display having a cylinder including a torque engine and defining a bend radius for the flexible display which is greater than or equal a minimum bend radius of the flexible display, a rigid sheet coupled to the cylinder, the rigid sheet to support the flexible display, and a rigid support that defines a channel to slidably receive the rigid sheet in the channel. The rigid support may include a first stop positioned along the channel to inhibit the rigid sheet from sliding beyond the first stop and a second stop positioned along the channel to inhibit the rigid sheet from sliding beyond the second stop.

Example 2 includes a support assembly for a flexible display having a first channel support defining a bend radius for the flexible display which is greater than or equal to a minimum bend radius of the flexible display and a first channel in the first channel support to receive a first edge of the flexible display and a display backplane, and a second channel support to provide the bend radius and a second channel in the second channel support to receive a second edge of the flexible display opposite to the first edge of the flexible display and a second edge of the display backplane. The support assembly may further include a rigid link coupled between the first and second channel supports.

Example 3 is a portable processing device, including a device body having a front surface, a back surface, a first end of the device body along aligned respective first sides of the front and back surfaces of the device body, and a second end of the device body opposite to the first end of the device body along aligned respective second sides of the front and back surfaces. A flexible display may be coupled to the front surface of the device body at an inner portion of the flexible display, wherein a first outer portion of the flexible display extends beyond the first end of the device body, wherein a second outer portion of the flexible display extends beyond the second end of the device body, a first bend portion of the flexible display is positioned between the inner portion of the flexible display and the first outer portion of the flexible display, and wherein a second bend portion of the flexible display is positioned between the inner portion of the flexible display and the second outer portion of the flexible display. A first hinge may be coupled to the device body proximate to the first end of the device body to support the first outer portion of the flexible display through a range of motion from a first position wherein the first outer portion of the flexible display is substantially coplanar with the inner portion of the flexible display and a second position wherein the first outer portion of the flexible display is folded backward around the first end of the device body. A second hinge may be coupled to the device body proximate to the second end of the device body to support the second outer portion of the flexible display through a range of motion from a third position wherein the second outer portion of the flexible display is substantially coplanar with the inner portion of the flexible display and a fourth position wherein the second outer portion of the flexible display is folded backward around the second end of the device body. A first super-elastic sheet may be positioned to support the flexible display at least in a first region corresponding to the first bend portion of the flexible display, and a second super-elastic sheet may be positioned to support the flexible display at least in a second region corresponding to the second bend portion of the flexible display. For example, the first and second super-elastic sheets may be made from a super-elastic metal alloy. For example, the first and second super-elastic sheets may be made from nitinol. The first hinge may further include a first cylinder to provide a first bend radius that is greater than or equal to a minimum bend radius of the flexible display, and the second hinge may further comprise a second cylinder to provide a second bend radius that is greater than or equal to the minimum bend radius of the flexible display. In example 3, the first bend radius may be the same as the second bend radius and there may be no overlap between the first outer portion of the flexible display and the second outer portion of the flexible display along the back surface of the device body.

Example 4 is a support assembly including a flexible display that can fold forward beyond flat (e.g. hyper extend) and hinge and support structure to support the flexible display through a wider range of motion (e.g. approaching 360 degrees).

Example 5 is an external display monitor with a backward foldable display as described herein such that the user can selectively increase the display monitor size.

Example 6 is a flat screen television with a backward foldable display as described herein such that the user can selectively change the aspect ratio of the television. For example, the television may have a 16:9 aspect ratio for most high definition content and may be adjustable to 1.85:1 or 2.39:1 for cinematic movie content.

Example sizes/models/values/ranges may have been given, although embodiments are not limited to the same. As manufacturing techniques (e.g., OLED display manufacturing) mature over time, it is expected that devices of smaller size or tighter bend radii could be manufactured. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., structures) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal, chronological, or orientation significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A portable processing device, comprising:
    a device body having a front surface, a back surface, a first end of the device body along aligned respective first sides of the front and back surfaces of the device body, and a second end of the device body opposite to the first end of the device body along aligned respective second sides of the front and back surfaces;
    a flexible display coupled to the front surface of the device body at an inner portion of the flexible display, wherein a first outer portion of the flexible display extends beyond the first end of the device body, wherein a second outer portion of the flexible display extends beyond the second end of the device body, a first bend portion of the flexible display is positioned between the inner portion of the flexible display and the first outer portion of the flexible display, and wherein a second bend portion of the flexible display is positioned between the inner portion of the flexible display and the second outer portion of the flexible display;
    a first hinge coupled to the device body proximate to the first end of the device body to support the first outer portion of the flexible display, the first hinge comprising:
        a first cylinder to provide a first bend radius which is greater than or equal to a minimum bend radius of the flexible display; and
        a first rigid sheet coupled to the first cylinder to support the flexible display in at least a portion of the first outer portion of the flexible display;
    a second hinge coupled to the device body proximate to the second end of the device body to support the second outer portion of the flexible display, the second hinge comprising:

a second cylinder to provide a second bend radius which is greater than or equal to the minimum bend radius of the flexible display; and a second rigid sheet coupled to the second cylinder to support the flexible display in at least a portion of the second outer portion of the flexible display;

a first super-elastic sheet positioned to support the flexible display at least in a first region corresponding to the first bend portion of the flexible display; and a second super-elastic sheet positioned to support the flexible display at least in a second region corresponding to the second bend portion of the flexible display.

2. The portable processing device of claim 1, wherein the first and second super-elastic sheets each comprise a super-elastic metal alloy.

3. The portable processing device of claim 1, wherein the first hinge is to support the first outer portion of the flexible display through a range of motion from a first position wherein the first outer portion of the flexible display is substantially coplanar with the inner portion of the flexible display and a second position wherein the first outer portion of the flexible display is folded backward around the first end of the device body, and wherein the second hinge is to support the second outer portion of the flexible display through a range of motion from a third position wherein the second outer portion of the flexible display is substantially coplanar with the inner portion of the flexible display and a fourth position wherein the second outer portion of the flexible display is folded backward around the second end of the device body.

4. The portable processing device of claim 3, further comprising:

a first rigid support coupled to the first outer portion of the flexible display, the first rigid support including a first slot to slidably receive the first rigid sheet; and a second rigid support coupled to the second outer portion of the flexible display, the second rigid support including a second slot to slidably receive the second rigid sheet.

5. The portable processing device of claim 4, wherein the first rigid support includes a first stop positioned along the first slot to inhibit the first rigid sheet from sliding beyond the first stop in the first position and a second stop positioned along the first slot to inhibit the first rigid sheet from sliding beyond the second stop in the second position, and wherein the second rigid support includes a third stop positioned along the second slot to inhibit the second rigid sheet from sliding beyond the third stop in the third position and a fourth stop positioned along the second slot to inhibit the second rigid sheet from sliding beyond the fourth stop in the fourth position.

6. The portable processing device of claim 1, wherein the first bend radius is different from the second bend radius to support substantially flat overlap between the first outer portion of the flexible display and the second outer portion of the flexible display along the back surface of the device body.

7. A portable processing device, comprising:

a device body having a front surface, a back surface, and an end surface along aligned respective first sides of the front and back surfaces of the device body;

a flexible display coupled to the front surface of the device body at an inner portion of the flexible display, wherein an outer portion of the flexible display extends beyond the end surface of the device body, and a bend portion of the flexible display is positioned between the inner portion of the flexible display and the outer portion of the flexible display;

a hinge coupled to the device body proximate to the end surface to support the outer portion of the flexible display through a range of motion from a first position wherein the outer portion of the flexible display is substantially coplanar with the inner portion of the flexible display and a second position wherein the outer portion of the flexible display is folded around the end surface of the device body, the hinge comprising:

a cylinder to provide a bend radius that is greater than or equal to a minimum bend radius of the flexible display, and a rigid sheet coupled to the cylinder to support the flexible display in at least a portion of the outer portion of the flexible display; and a super-elastic sheet positioned to support the flexible display at least in a first region corresponding to the bend portion of the flexible display.

8. The portable processing device of claim 7, wherein the super-elastic sheet comprises a super-elastic metal alloy.

9. The portable processing device of claim 7, further comprising:

a rigid support coupled to the outer portion of the flexible display, the rigid support including a slot to slidably receive the rigid sheet.

10. The portable processing device of claim 9, wherein the rigid support includes a first stop positioned along the slot to inhibit the rigid sheet from sliding beyond the first stop in the first position and a second stop positioned along the slot to inhibit the rigid sheet from sliding beyond the second stop in the second position.

11. The portable processing device of claim 7, further comprising a backplane coupled to the flexible display, wherein at least a portion of the backplane comprises a super-elastic sheet.

12. The portable processing device of claim 11, wherein the backplane comprises:

a first rigid sheet metal portion;

a second rigid sheet metal portion; and the super-elastic sheet joined between the first and second rigid sheet metal portions.

13. The portable processing device of claim 12, wherein the backplane further comprises:

a third rigid sheet metal portion; and a second super-elastic sheet joined between the second and third rigid sheet metal portions.

14. The portable processing device of claim 11, wherein the super-elastic sheet comprises a super-elastic metal alloy.

15. A portable processing device, comprising:

a device body having a front surface, a back surface, a first end of the device body along aligned respective first sides of the front and back surfaces of the device body, and a second end of the device body opposite to the first end of the device body along aligned respective second sides of the front and back surfaces;

a flexible display coupled to the front surface of the device body at an inner portion of the flexible display, wherein a first outer portion of the flexible display extends beyond the first end of the device body, wherein a second outer portion of the flexible display extends beyond the second end of the device body, a first bend portion of the flexible display is positioned between the inner portion of the flexible display and the first outer portion of the flexible display, and wherein a second bend portion of the flexible display is positioned between the inner portion of the flexible display and the second outer portion of the flexible display;
a first hinge coupled to the device body proximate to the first end of the device body to support the first outer portion of the flexible display;
a second hinge coupled to the device body proximate to the second end of the device body to support the second outer portion of the flexible display;
a first super-elastic sheet positioned to support the flexible display at least in a first region corresponding to the first bend portion of the flexible display; and
a second super-elastic sheet positioned to support the flexible display at least in a second region corresponding to the second bend portion of the flexible display,
wherein the first hinge further comprises a first channel support to provide a first bend radius that is greater than or equal to a minimum bend radius of the flexible display and a first channel in the first channel support to receive a first edge of the flexible display and a first edge of the first super-elastic sheet, and
wherein the second hinge further comprises a second channel support to provide a second bend radius that is greater than or equal to the minimum bend radius of the flexible display and a second channel in the second channel support to receive a second edge of the flexible display and a first edge of the second super-elastic sheet.

16. The portable processing device of claim 15, wherein the first super-elastic sheet extends to support the first outer portion of the flexible display and wherein the first hinge further comprises:
a third channel support to provide the first bend radius and a third channel in the third channel support to receive a third edge of the flexible display opposite to the first edge of the flexible display and a second edge of the first super-elastic sheet,
and wherein the second super-elastic sheet extends to support the second outer portion of the flexible display and wherein the second hinge further comprises:
a fourth channel support to provide the second bend radius and a fourth channel in the fourth channel support to receive a fourth edge of the flexible display opposite to the second edge of the flexible display and a second edge of the second super-elastic sheet.

17. The portable processing device of claim 16, wherein the first super-elastic sheet is anchored to the device body proximate to the first end of the device body and wherein the second super-elastic sheet is anchored to the device body proximate to the second end of the device body.

18. The portable processing device of claim 16, further comprising:
a first rigid link coupled between the first and third channel supports; and
a second rigid link coupled between the second and fourth channel supports.

19. A portable processing device, comprising:
a device body having a front surface, a back surface, and an end surface along aligned respective first sides of the front and back surfaces of the device body;
a flexible display coupled to the front surface of the device body at an inner portion of the flexible display, wherein an outer portion of the flexible display extends beyond the end surface of the device body, and a bend portion of the flexible display is positioned between the inner portion of the flexible display and the outer portion of the flexible display;
a hinge coupled to the device body proximate to the end surface to support the outer portion of the flexible display through a range of motion from a first position wherein the outer portion of the flexible display is substantially coplanar with the inner portion of the flexible display and a second position wherein the outer portion of the flexible display is folded around the end surface of the device body; and
a super-elastic sheet positioned to support the flexible display at least in a first region corresponding to the bend portion of the flexible display,
wherein the hinge further comprises:
a first channel support to provide a bend radius that is greater than or equal to a minimum bend radius of the flexible display and a first channel in the first channel support to receive a first edge of the flexible display and a first edge of the super-elastic sheet; and
a second channel support to provide the bend radius and a second channel in the second channel support to receive a second edge of the flexible display opposite to the first edge of the flexible display and a second edge of the super-elastic sheet.

20. The portable processing device of claim 19, wherein the super-elastic sheet extends to support the outer portion of the flexible display.

21. The portable processing device of claim 20, wherein the super-elastic sheet is anchored to the device body proximate to the end surface of the device body.

22. The portable processing device of claim 20, further comprising:
a rigid link coupled between the first and second channel supports.

* * * * *